US009830285B2

(12) United States Patent
Wolrich et al.

(10) Patent No.: US 9,830,285 B2
(45) Date of Patent: *Nov. 28, 2017

(54) MEMORY MAPPING IN A PROCESSOR HAVING MULTIPLE PROGRAMMABLE UNITS

(71) Applicant: Intel Corporation, Santa Clara, CA (US)

(72) Inventors: Gilbert Wolrich, Farmingham, MA (US); Debra Bernstein, Sudbury, MA (US); Daniel Cutter, Townsend, MA (US); Christopher Dolan, Milford, MA (US); Matthew J. Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/882,867

(22) Filed: Oct. 14, 2015

(65) Prior Publication Data

US 2016/0071558 A1    Mar. 10, 2016

Related U.S. Application Data

(63) Continuation of application No. 14/809,423, filed on Jul. 27, 2015, which is a continuation of application
(Continued)

(51) Int. Cl.
*G06F 13/20* (2006.01)
*G06F 12/0806* (2016.01)
(Continued)

(52) U.S. Cl.
CPC ............ *G06F 13/20* (2013.01); *G06F 3/0622* (2013.01); *G06F 3/0661* (2013.01);
(Continued)

(58) Field of Classification Search
CPC .. G06F 12/0223; G06F 12/0284; G06F 12/06; G06F 12/0806
(Continued)

(56) References Cited

U.S. PATENT DOCUMENTS 3,373,408 A    3/1968  Ling
3,478,322 A    11/1969 Evans
(Continued)

FOREIGN PATENT DOCUMENTS

EP    0379709    8/1990
EP    0464715    1/1992
(Continued)

OTHER PUBLICATIONS

Byrd et al., "Multithread Processor Architectures," IEEE Spectrum, vol. 32, No. 8, New York, Aug. 1, 1995, pp. 38-46.
(Continued)

*Primary Examiner* — Prasith Thammavong
(74) *Attorney, Agent, or Firm* — Trop, Pruner & Hu, P.C.

(57) ABSTRACT

The disclosure includes, in general, among other aspects, an apparatus having multiple programmable units integrated within a processor. The apparatus has circuitry to map addresses in a single address space to resources within the multiple programmable units where the single address space includes addresses for different ones of the resources in different ones of the multiple programmable units and where there is a one-to-one correspondence between respective addresses in the single address space and resources within the multiple programmable units.

1 Claim, 10 Drawing Sheets

Related U.S. Application Data

No. 14/286,055, filed on May 23, 2014, now Pat. No. 9,128,818, which is a continuation of application No. 10/780,330, filed on Feb. 17, 2004, now Pat. No. 8,738,886, which is a continuation of application No. 09/473,271, filed on Dec. 27, 1999, now Pat. No. 6,694,380.

(51) Int. Cl.
| | | |
|---|---|---|
| *G06F 12/06* | (2006.01) | |
| *G06F 12/02* | (2006.01) | |
| *G06F 3/06* | (2006.01) | |
| *G06F 13/28* | (2006.01) | |
| *G06F 13/40* | (2006.01) | |
| *G06F 15/76* | (2006.01) | |
| *G06F 15/173* | (2006.01) | |
| *G11C 7/10* | (2006.01) | |
| *G06F 12/10* | (2016.01) | |
| *G06F 12/109* | (2016.01) | |

(52) U.S. Cl.
CPC ........ *G06F 3/0679* (2013.01); *G06F 12/0223* (2013.01); *G06F 12/0284* (2013.01); *G06F 12/06* (2013.01); *G06F 12/0806* (2013.01); *G06F 13/28* (2013.01); *G06F 13/4027* (2013.01); *G06F 15/17318* (2013.01); *G06F 15/76* (2013.01); *G11C 7/1033* (2013.01); *G11C 7/1072* (2013.01); *G06F 12/10* (2013.01); *G06F 12/109* (2013.01); *G06F 2212/1041* (2013.01); *G06F 2212/206* (2013.01); *G06F 2212/251* (2013.01)

(58) Field of Classification Search
USPC ........................................................ 711/202
See application file for complete search history.

(56) References Cited

U.S. PATENT DOCUMENTS

| | | |
|---|---|---|
| 3,623,001 A | 11/1971 | Kleist et al. |
| 3,736,566 A | 5/1973 | Anderson et al. |
| 3,792,441 A | 2/1974 | Wymore et al. |
| 3,889,243 A | 6/1975 | Drimak |
| 3,940,745 A | 2/1976 | Sajeva |
| 4,016,548 A | 4/1977 | Law et al. |
| 4,032,899 A | 6/1977 | Jenny et al. |
| 4,075,691 A | 2/1978 | Davis et al. |
| 4,130,890 A | 12/1978 | Adam |
| 4,400,770 A | 8/1983 | Chan et al. |
| 4,514,807 A | 4/1985 | Nogi |
| 4,523,272 A | 6/1985 | Fukunaga et al. |
| 4,658,351 A | 4/1987 | Teng |
| 4,709,347 A | 11/1987 | Kirk |
| 4,745,544 A | 5/1988 | Renner et al. |
| 4,788,640 A | 11/1988 | Hansen |
| 4,831,358 A | 5/1989 | Ferrio et al. |
| 4,858,108 A | 8/1989 | Ogawa et al. |
| 4,866,664 A | 9/1989 | Burkhardt, Jr. et al. |
| 4,890,218 A | 12/1989 | Bram |
| 4,890,222 A | 12/1989 | Kirk |
| 4,991,112 A | 2/1991 | Callemyn |
| 5,115,507 A | 5/1992 | Callemyn |
| 5,140,685 A | 8/1992 | Sipple et al. |
| 5,142,683 A | 8/1992 | Burkhardt, Jr. et al. |
| 5,155,831 A | 10/1992 | Emma et al. |
| 5,155,854 A | 10/1992 | Flynn et al. |
| 5,168,555 A | 12/1992 | Byers et al. |
| 5,173,897 A | 12/1992 | Schrodi et al. |
| 5,201,039 A * | 4/1993 | Sakamura ............ G06F 9/30101 |
| | | 711/201 |
| 5,251,205 A | 10/1993 | Callon et al. |
| 5,255,239 A | 10/1993 | Taborn et al. |
| 5,263,169 A | 11/1993 | Genusov et al. |
| 5,313,454 A | 5/1994 | Bustini et al. |
| 5,347,648 A | 9/1994 | Stamm et al. |
| 5,367,678 A | 11/1994 | Lee et al. |
| 5,379,295 A | 1/1995 | Yonehara |
| 5,379,432 A | 1/1995 | Orton et al. |
| 5,390,329 A | 2/1995 | Gaertner et al. |
| 5,392,391 A | 2/1995 | Caulk, Jr. et al. |
| 5,392,411 A | 2/1995 | Ozaki |
| 5,392,412 A | 2/1995 | McKenna |
| 5,404,464 A | 4/1995 | Bennett |
| 5,404,469 A | 4/1995 | Chung et al. |
| 5,404,482 A | 4/1995 | Stamm et al. |
| 5,432,918 A | 7/1995 | Stamm |
| 5,448,702 A | 9/1995 | Garcia, Jr. et al. |
| 5,450,351 A | 9/1995 | Heddes |
| 5,452,437 A | 9/1995 | Richey et al. |
| 5,452,452 A | 9/1995 | Gaetner et al. |
| 5,459,842 A | 10/1995 | Begun et al. |
| 5,459,843 A | 10/1995 | Davis et al. |
| 5,463,625 A | 10/1995 | Yasrebi |
| 5,467,452 A | 11/1995 | Blum et al. |
| 5,475,856 A | 12/1995 | Kogge |
| 5,485,455 A | 1/1996 | Dobbins et al. |
| 5,515,296 A | 5/1996 | Agarwal |
| 5,517,648 A | 5/1996 | Bertone et al. |
| 5,539,737 A | 7/1996 | Lo et al. |
| 5,542,070 A | 7/1996 | LeBlanc et al. |
| 5,542,088 A | 7/1996 | Jennings, Jr. et al. |
| 5,544,236 A | 8/1996 | Andruska et al. |
| 5,550,816 A | 8/1996 | Hardwick et al. |
| 5,557,766 A | 9/1996 | Takiguchi et al. |
| 5,568,476 A | 10/1996 | Sherer et al. |
| 5,568,617 A | 10/1996 | Kametani |
| 5,574,922 A | 11/1996 | James |
| 5,581,729 A | 12/1996 | Nistala et al. |
| 5,592,622 A | 1/1997 | Isfeld et al. |
| 5,598,560 A * | 1/1997 | Benson ................ G06F 8/52 |
| | | 717/147 |
| 5,613,071 A | 3/1997 | Rankin et al. |
| 5,613,136 A | 3/1997 | Casavant et al. |
| 5,617,327 A | 4/1997 | Duncan |
| 5,623,489 A | 4/1997 | Cotton et al. |
| 5,627,829 A | 5/1997 | Gleeson et al. |
| 5,630,074 A | 5/1997 | Beltran |
| 5,630,130 A | 5/1997 | Perotto et al. |
| 5,633,865 A | 5/1997 | Short |
| 5,644,623 A | 7/1997 | Gutledge |
| 5,649,110 A | 7/1997 | Ben-Nun et al. |
| 5,649,157 A | 7/1997 | Williams |
| 5,651,002 A | 7/1997 | Van Seters et al. |
| 5,659,687 A | 8/1997 | Kim et al. |
| 5,680,641 A | 10/1997 | Sidman |
| 5,689,566 A | 11/1997 | Nguyen |
| 5,692,126 A | 11/1997 | Templeton et al. |
| 5,699,537 A | 12/1997 | Sharangpani et al. |
| 5,701,434 A | 12/1997 | Nakagawa |
| 5,717,898 A | 2/1998 | Kagan et al. |
| 5,721,870 A | 2/1998 | Matsumoto |
| 5,724,574 A | 3/1998 | Stratigos et al. |
| 5,740,402 A | 4/1998 | Bratt et al. |
| 5,742,587 A | 4/1998 | Zornig et al. |
| 5,742,782 A | 4/1998 | Ito et al. |
| 5,742,822 A | 4/1998 | Motomura |
| 5,745,913 A | 4/1998 | Pattin et al. |
| 5,751,987 A | 5/1998 | Mahant-Shetti et al. |
| 5,754,764 A | 5/1998 | Davis et al. |
| 5,761,507 A | 6/1998 | Govett |
| 5,761,522 A | 6/1998 | Hisanga et al. |
| 5,764,915 A | 6/1998 | Heimsoth et al. |
| 5,768,528 A | 6/1998 | Strumm |
| 5,781,551 A | 7/1998 | Born |
| 5,781,774 A | 7/1998 | Krick |
| 5,784,649 A | 7/1998 | Begur et al. |
| 5,784,712 A | 7/1998 | Byers et al. |
| 5,796,413 A | 8/1998 | Shipp et al. |
| 5,797,043 A | 8/1998 | Lewis et al. |
| 5,805,816 A | 9/1998 | Picazo, Jr. et al. |
| 5,809,235 A | 9/1998 | Sharma et al. |

(56) References Cited

U.S. PATENT DOCUMENTS

| | | |
|---|---|---|
| 5,809,237 A | 9/1998 | Watts et al. |
| 5,809,530 A | 9/1998 | Samra et al. |
| 5,812,868 A | 9/1998 | Moyer et al. |
| 5,828,746 A | 10/1998 | Ardon |
| 5,828,863 A | 10/1998 | Barrett et al. |
| 5,828,881 A | 10/1998 | Wang |
| 5,828,901 A | 10/1998 | O'Toole et al. |
| 5,832,215 A | 11/1998 | Kato et al. |
| 5,835,755 A | 11/1998 | Stellwagen, Jr. |
| 5,838,988 A | 11/1998 | Panwar et al. |
| 5,850,399 A | 12/1998 | Ganmukhi et al. |
| 5,850,530 A | 12/1998 | Chen et al. |
| 5,854,922 A | 12/1998 | Gravenstein et al. |
| 5,857,188 A | 1/1999 | Douglas |
| 5,860,138 A | 1/1999 | Engebretsen et al. |
| 5,860,158 A | 1/1999 | Pai et al. |
| 5,886,992 A | 3/1999 | Raatikaien et al. |
| 5,887,134 A | 3/1999 | Ebrahim |
| 5,890,208 A | 3/1999 | Kwon |
| 5,892,979 A | 4/1999 | Shiraki et al. |
| 5,898,686 A | 4/1999 | Virgile |
| 5,898,701 A | 4/1999 | Johnson |
| 5,905,876 A | 5/1999 | Pawlowski et al. |
| 5,905,889 A | 5/1999 | Wilhelm, Jr. |
| 5,909,686 A | 6/1999 | Muller et al. |
| 5,915,123 A | 6/1999 | Mirsky et al. |
| 5,918,235 A | 6/1999 | Kirshenbaum et al. |
| 5,933,627 A | 8/1999 | Parady |
| 5,937,187 A | 8/1999 | Kosche et al. |
| 5,938,736 A | 8/1999 | Muller et al. |
| 5,940,612 A | 8/1999 | Brady et al. |
| 5,940,866 A | 8/1999 | Chisholm et al. |
| 5,946,487 A | 8/1999 | Dangelo |
| 5,948,081 A | 9/1999 | Foster |
| 5,958,031 A | 9/1999 | Kime |
| 5,961,628 A | 10/1999 | Nguyen et al. |
| 5,968,169 A | 10/1999 | Pickett |
| 5,970,013 A | 10/1999 | Fischer et al. |
| 5,974,467 A * | 10/1999 | Haddock ............... H04L 12/46 370/236 |
| 5,974,518 A | 10/1999 | Nogradi |
| 5,978,838 A | 11/1999 | Mohammed et al. |
| 5,983,274 A | 11/1999 | Hyder et al. |
| 5,995,513 A | 11/1999 | Harrand et al. |
| 6,011,791 A * | 1/2000 | Okada ............... G06F 15/17375 370/352 |
| 6,012,151 A | 1/2000 | Mano |
| 6,014,729 A | 1/2000 | Lannan et al. |
| 6,023,742 A | 2/2000 | Ebeling et al. |
| 6,032,190 A | 2/2000 | Bremer et al. |
| 6,032,218 A | 2/2000 | Lewin et al. |
| 6,047,002 A | 4/2000 | Hartmann et al. |
| 6,049,867 A | 4/2000 | Eickemeyer et al. |
| 6,055,605 A | 4/2000 | Sharma et al. |
| 6,058,168 A | 5/2000 | Braband |
| 6,061,710 A | 5/2000 | Eickemeyer et al. |
| 6,067,300 A | 5/2000 | Baumert et al. |
| 6,067,585 A | 5/2000 | Hoang |
| 6,070,231 A | 5/2000 | Ottinger |
| 6,072,781 A | 6/2000 | Feeney et al. |
| 6,073,215 A | 6/2000 | Snyder |
| 6,079,008 A | 6/2000 | Clery, III |
| 6,085,215 A | 7/2000 | Ramakrishnan et al. |
| 6,085,248 A | 7/2000 | Sambamurthy et al. |
| 6,085,294 A | 7/2000 | Van Doren et al. |
| 6,092,127 A | 7/2000 | Tausheck |
| 6,092,158 A | 7/2000 | Harriman et al. |
| 6,104,700 A | 8/2000 | Haddock et al. |
| 6,111,886 A | 8/2000 | Stewart |
| 6,112,016 A | 8/2000 | MacWilliams et al. |
| 6,122,251 A | 9/2000 | Shinohara |
| 6,128,669 A | 10/2000 | Moriarty et al. |
| 6,134,665 A | 10/2000 | Klein et al. |
| 6,138,240 A | 10/2000 | Tran et al. |
| 6,141,677 A | 10/2000 | Hanif et al. |
| 6,141,689 A | 10/2000 | Yasrebi |
| 6,141,765 A | 10/2000 | Sherman |
| 6,144,669 A | 11/2000 | Williams et al. |
| 6,145,054 A | 11/2000 | Mehrotra et al. |
| 6,157,955 A | 12/2000 | Narad et al. |
| 6,160,562 A | 12/2000 | Chin et al. |
| 6,170,051 B1 | 1/2001 | Dowling |
| 6,175,927 B1 | 1/2001 | Cromer et al. |
| 6,182,177 B1 | 1/2001 | Harriman |
| 6,195,676 B1 | 2/2001 | Spix et al. |
| 6,199,133 B1 | 3/2001 | Schnell |
| 6,201,807 B1 | 3/2001 | Prasanna |
| 6,212,542 B1 | 4/2001 | Kahle et al. |
| 6,212,544 B1 | 4/2001 | Borkenhagen et al. |
| 6,212,604 B1 | 4/2001 | Tremblay |
| 6,212,611 B1 | 4/2001 | Nizar et al. |
| 6,216,220 B1 | 4/2001 | Hwang |
| 6,223,207 B1 | 4/2001 | Lucovsky et al. |
| 6,223,238 B1 | 4/2001 | Meyer et al. |
| 6,223,243 B1 | 4/2001 | Ueda et al. |
| 6,223,274 B1 | 4/2001 | Catthoor et al. |
| 6,223,279 B1 | 4/2001 | Nishimura et al. |
| 6,247,025 B1 | 6/2001 | Bacon |
| 6,256,713 B1 | 7/2001 | Audityan et al. |
| 6,256,775 B1 * | 7/2001 | Flynn ............... G06F 9/3851 712/E9.053 |
| 6,269,391 B1 | 7/2001 | Gillespie |
| 6,272,109 B1 | 8/2001 | Pei et al. |
| 6,272,520 B1 | 8/2001 | Sharangpani et al. |
| 6,272,616 B1 | 8/2001 | Fernando et al. |
| 6,275,505 B1 | 8/2001 | O'Loughlin et al. |
| 6,279,113 B1 | 8/2001 | Vaidya |
| 6,282,169 B1 | 8/2001 | Kiremidjian |
| 6,286,083 B1 | 9/2001 | Chin et al. |
| 6,289,011 B1 | 9/2001 | Seo et al. |
| 6,295,600 B1 | 9/2001 | Parady |
| 6,298,370 B1 | 10/2001 | Tang et al. |
| 6,307,789 B1 | 10/2001 | Wolrich et al. |
| 6,311,261 B1 | 10/2001 | Chamdani et al. |
| 6,320,861 B1 | 11/2001 | Adam et al. |
| 6,324,624 B1 | 11/2001 | Wolrich et al. |
| 6,335,932 B2 | 1/2002 | Kadambi et al. |
| 6,338,078 B1 | 1/2002 | Chang et al. |
| 6,341,347 B1 * | 1/2002 | Joy ............... G06F 9/3851 711/E12.043 |
| 6,345,334 B1 | 2/2002 | Nakagawa et al. |
| 6,347,344 B1 | 2/2002 | Baker et al. |
| 6,349,331 B1 | 2/2002 | Andra et al. |
| 6,356,962 B1 | 3/2002 | Kasper et al. |
| 6,359,911 B1 | 3/2002 | Movshovich et al. |
| 6,360,262 B1 | 3/2002 | Guenthner et al. |
| 6,360,277 B1 | 3/2002 | Rickley et al. |
| 6,366,998 B1 | 4/2002 | Mohamed |
| 6,373,848 B1 | 4/2002 | Allison et al. |
| 6,377,998 B2 | 4/2002 | Noll et al. |
| 6,389,031 B1 | 5/2002 | Chao et al. |
| 6,389,449 B1 | 5/2002 | Nemirovsky et al. |
| 6,393,026 B1 | 5/2002 | Irwin |
| 6,393,483 B1 | 5/2002 | Latif et al. |
| 6,404,737 B1 | 6/2002 | Novik et al. |
| 6,415,338 B1 | 7/2002 | Habot |
| 6,418,488 B1 | 7/2002 | Chilton et al. |
| 6,424,657 B1 | 7/2002 | Voit et al. |
| 6,424,659 B2 | 7/2002 | Viswanadham et al. |
| 6,426,940 B1 | 7/2002 | Seo et al. |
| 6,426,943 B1 | 7/2002 | Spinney et al. |
| 6,427,196 B1 | 7/2002 | Adiletta et al. |
| 6,430,626 B1 | 8/2002 | Witkowski et al. |
| 6,434,145 B1 | 8/2002 | Opsasnick et al. |
| 6,438,132 B1 | 8/2002 | Vincent et al. |
| 6,438,134 B1 | 8/2002 | Chow et al. |
| 6,448,812 B1 | 9/2002 | Bacigalupo |
| 6,453,404 B1 | 9/2002 | Bereznyi et al. |
| 6,457,015 B1 | 9/2002 | Eastham |
| 6,463,035 B1 | 10/2002 | Moore |
| 6,463,072 B1 | 10/2002 | Wolrich et al. |
| 6,463,480 B2 | 10/2002 | Kikuchi et al. |
| 6,463,527 B1 | 10/2002 | Vishkin |
| 6,466,898 B1 | 10/2002 | Chan |

(56) References Cited

U.S. PATENT DOCUMENTS

| | | |
|---|---|---|
| 6,477,562 B2 | 11/2002 | Nemirovsky et al. |
| 6,484,224 B1 | 11/2002 | Robins et al. |
| 6,490,285 B2 | 12/2002 | Lee et al. |
| 6,501,731 B1 | 12/2002 | Chong et al. |
| 6,507,862 B1 | 1/2003 | Joy et al. |
| 6,513,082 B1 | 1/2003 | Fischer et al. |
| 6,522,188 B1 | 2/2003 | Poole |
| 6,526,451 B2 | 2/2003 | Kasper |
| 6,526,452 B1 | 2/2003 | Petersen et al. |
| 6,529,983 B1 | 3/2003 | Marshall |
| 6,532,509 B1 | 3/2003 | Wolrich et al. |
| 6,535,878 B1 | 3/2003 | Guedalia et al. |
| 6,552,826 B2 | 4/2003 | Adler et al. |
| 6,553,406 B1 | 4/2003 | Berger et al. |
| 6,560,667 B1 | 5/2003 | Wolrich et al. |
| 6,570,850 B1 | 5/2003 | Guiterrez et al. |
| 6,577,542 B2 | 6/2003 | Wolrich et al. |
| 6,584,522 B1 | 6/2003 | Wolrich et al. |
| 6,587,906 B2 | 7/2003 | Wolrich et al. |
| 6,604,125 B1 | 8/2003 | Belkin |
| 6,606,704 B1 | 8/2003 | Adiletta et al. |
| 6,625,654 B1 | 9/2003 | Wolrich et al. |
| 6,628,668 B1 | 9/2003 | Hutzli et al. |
| 6,629,147 B1 | 9/2003 | Grow |
| 6,629,236 B1 | 9/2003 | Aipperspach et al. |
| 6,631,422 B1 | 10/2003 | Althaus et al. |
| 6,631,430 B1 | 10/2003 | Wolrich et al. |
| 6,631,462 B1 | 10/2003 | Wolrich et al. |
| 6,646,868 B2 | 11/2003 | Ho et al. |
| 6,657,963 B1 | 12/2003 | Paquette et al. |
| 6,658,551 B1 | 12/2003 | Berenbaum et al. |
| 6,661,794 B1 | 12/2003 | Wolrich et al. |
| 6,665,699 B1 | 12/2003 | Hunter et al. |
| 6,665,755 B2 | 12/2003 | Modelski et al. |
| 6,667,920 B2 | 12/2003 | Wolrich et al. |
| 6,668,317 B1 | 12/2003 | Bernstein |
| 6,671,827 B2 | 12/2003 | Guilford et al. |
| 6,675,190 B1 | 1/2004 | Schabernack et al. |
| 6,675,192 B2 | 1/2004 | Emer et al. |
| 6,678,746 B1 | 1/2004 | Russell et al. |
| 6,680,933 B1 | 1/2004 | Cheesman et al. |
| 6,681,300 B2 | 1/2004 | Wolrich et al. |
| 6,684,326 B1 | 1/2004 | Cromer et al. |
| 6,694,380 B1 | 2/2004 | Wolrich et al. |
| 6,697,379 B1 | 2/2004 | Jacquet et al. |
| 6,721,325 B1 | 4/2004 | Duckering et al. |
| 6,724,767 B1 | 4/2004 | Chong et al. |
| 6,728,845 B2 | 4/2004 | Adiletta |
| 6,732,187 B1 | 5/2004 | Lougheed et al. |
| 6,754,211 B1 | 6/2004 | Brown |
| 6,754,222 B1 | 6/2004 | Joung et al. |
| 6,768,717 B1 | 7/2004 | Reynolds et al. |
| 6,775,284 B1 | 8/2004 | Calvignac et al. |
| 6,779,084 B2 | 8/2004 | Wolrich et al. |
| 6,782,447 B2 | 8/2004 | Ostler et al. |
| 6,792,488 B2 | 9/2004 | Wolrich et al. |
| 6,798,744 B1 | 9/2004 | Loewen et al. |
| 6,826,615 B2 | 11/2004 | Barrall et al. |
| 6,834,053 B1 | 12/2004 | Stacey et al. |
| 6,850,521 B1 | 2/2005 | Kadambi et al. |
| 6,856,622 B1 | 2/2005 | Calamvokis et al. |
| 6,873,618 B1 | 3/2005 | Weaver |
| 6,876,561 B2 | 4/2005 | Wolrich et al. |
| 6,895,457 B2 | 5/2005 | Wolrich et al. |
| 6,925,637 B2 | 8/2005 | Thomas et al. |
| 6,931,641 B1 | 8/2005 | Davis et al. |
| 6,934,780 B2 | 8/2005 | Modelski et al. |
| 6,934,951 B2 | 8/2005 | Wilkinson et al. |
| 6,938,147 B1 | 8/2005 | Joy et al. |
| 6,940,857 B2 | 9/2005 | Weinman |
| 6,944,850 B2 | 9/2005 | Hooper et al. |
| 6,947,425 B1 | 9/2005 | Hooper et al. |
| 6,952,824 B1 | 10/2005 | Hooper et al. |
| 6,959,002 B2 | 10/2005 | Wynne et al. |
| 6,967,963 B1 | 11/2005 | Houh et al. |
| 6,976,095 B1 | 12/2005 | Wolrich et al. |
| 6,981,077 B2 | 12/2005 | Modelski et al. |
| 6,983,350 B1 | 1/2006 | Wheeler et al. |
| 7,006,495 B2 | 2/2006 | Hooper |
| 7,065,569 B2 | 6/2006 | Teraslinna |
| 7,069,548 B2 | 6/2006 | Kushlis |
| 7,076,654 B2 | 7/2006 | Kawamoto |
| 7,096,277 B2 | 8/2006 | Hooper |
| 7,100,102 B2 | 8/2006 | Hooper et al. |
| 7,107,413 B2 | 9/2006 | Rosenbluth et al. |
| 7,111,072 B1 | 9/2006 | Matthews et al. |
| 7,111,296 B2 | 9/2006 | Wolrich et al. |
| 7,124,196 B2 | 10/2006 | Hooper |
| 7,126,952 B2 | 10/2006 | Hooper et al. |
| 7,149,226 B2 | 12/2006 | Wolrich et al. |
| 7,149,786 B1 | 12/2006 | Bohringer et al. |
| 7,158,964 B2 | 1/2007 | Wolrich et al. |
| 7,181,573 B2 | 2/2007 | Wolrich et al. |
| 7,181,742 B2 | 2/2007 | Hooper |
| 7,191,321 B2 | 3/2007 | Bernstein et al. |
| 7,191,433 B2 | 3/2007 | Narad et al. |
| 7,206,858 B2 | 4/2007 | Hooper et al. |
| 7,248,584 B2 | 7/2007 | Hooper |
| 7,260,102 B2 | 8/2007 | Mehvar et al. |
| 7,269,179 B2 | 9/2007 | Wolrich et al. |
| 7,286,534 B2 | 10/2007 | Kloth |
| 7,305,500 B2 | 12/2007 | Adiletta et al. |
| 7,328,289 B2 | 2/2008 | Wolrich et al. |
| 7,352,769 B2 | 4/2008 | Hooper et al. |
| 7,424,579 B2 | 9/2008 | Wheeler et al. |
| 7,433,307 B2 | 10/2008 | Hooper et al. |
| 7,434,221 B2 | 10/2008 | Hooper et al. |
| 7,443,836 B2 | 10/2008 | Hooper et al. |
| 7,471,688 B2 | 12/2008 | Kalkunte et al. |
| 7,620,702 B1 | 11/2009 | Wolrich et al. |
| 7,751,402 B2 | 7/2010 | Wolrich et al. |
| 2001/0023487 A1 | 9/2001 | Kawamoto |
| 2001/0027512 A1* | 10/2001 | Hagersten ............ G06F 11/0712 711/202 |
| 2002/0027448 A1 | 3/2002 | Bacigalupo |
| 2002/0041520 A1 | 4/2002 | Wolrich et al. |
| 2002/0075878 A1 | 6/2002 | Lee et al. |
| 2002/0118692 A1 | 8/2002 | Oberman et al. |
| 2002/0150047 A1 | 10/2002 | Knight et al. |
| 2002/0181194 A1 | 12/2002 | Ho et al. |
| 2003/0043803 A1 | 3/2003 | Hooper |
| 2003/0067934 A1 | 4/2003 | Hooper et al. |
| 2003/0086434 A1 | 5/2003 | Kloth |
| 2003/0105901 A1 | 6/2003 | Wolrich et al. |
| 2003/0105917 A1 | 6/2003 | Ostler et al. |
| 2003/0110166 A1 | 6/2003 | Wolrich et al. |
| 2003/0115347 A1 | 6/2003 | Wolrich et al. |
| 2003/0115426 A1 | 6/2003 | Rosenbluth et al. |
| 2003/0131198 A1 | 7/2003 | Wolrich et al. |
| 2003/0140196 A1 | 7/2003 | Wolrich et al. |
| 2003/0145159 A1 | 7/2003 | Adiletta et al. |
| 2003/0147409 A1 | 8/2003 | Wolrich et al. |
| 2003/0161303 A1 | 8/2003 | Mehvar et al. |
| 2003/0161337 A1 | 8/2003 | Weinman |
| 2003/0196012 A1 | 10/2003 | Wolrich et al. |
| 2003/0210574 A1 | 11/2003 | Wolrich et al. |
| 2003/0231635 A1 | 12/2003 | Kalkunte et al. |
| 2004/0039895 A1 | 2/2004 | Wolrich et al. |
| 2004/0052269 A1 | 3/2004 | Hooper et al. |
| 2004/0054880 A1 | 3/2004 | Bernstein et al. |
| 2004/0059828 A1 | 3/2004 | Hooper et al. |
| 2004/0071152 A1 | 4/2004 | Wolrich et al. |
| 2004/0073728 A1 | 4/2004 | Wolrich et al. |
| 2004/0073778 A1 | 4/2004 | Adiletta et al. |
| 2004/0085901 A1 | 5/2004 | Hooper et al. |
| 2004/0098496 A1 | 5/2004 | Wolrich et al. |
| 2004/0109369 A1 | 6/2004 | Wolrich et al. |
| 2004/0148382 A1 | 7/2004 | Narad et al. |
| 2004/0162933 A1 | 8/2004 | Adiletta et al. |
| 2004/0252686 A1 | 12/2004 | Hooper et al. |
| 2005/0033884 A1 | 2/2005 | Wolrich et al. |
| 2005/0149665 A1 | 7/2005 | Wolrich et al. |

(56) References Cited

U.S. PATENT DOCUMENTS

| | | |
|---|---|---|
| 2006/0007871 A1 | 1/2006 | Welin |
| 2006/0069882 A1 | 3/2006 | Wheeler et al. |
| 2006/0156303 A1 | 7/2006 | Hooper et al. |

FOREIGN PATENT DOCUMENTS

| | | |
|---|---|---|
| EP | 0633678 | 1/1995 |
| EP | 0745933 | 12/1996 |
| EP | 0773648 | 5/1997 |
| EP | 0809180 | 11/1997 |
| EP | 0959602 | 11/1999 |
| JP | 59111533 | 6/1984 |
| WO | 9415287 A2 | 7/1994 |
| WO | 9738372 A1 | 10/1997 |
| WO | 9820647 A1 | 5/1998 |
| WO | 0038376 A1 | 6/2000 |
| WO | 0056024 A1 | 9/2000 |
| WO | 0115718 A1 | 3/2001 |
| WO | 0116718 A1 | 3/2001 |
| WO | 0116769 A1 | 3/2001 |
| WO | 0116770 A1 | 3/2001 |
| WO | 0116782 A2 | 3/2001 |
| WO | 0117179 A1 | 3/2001 |
| WO | 0131856 A1 | 5/2001 |
| WO | 0148596 A2 | 7/2001 |
| WO | 0148606 A2 | 7/2001 |
| WO | 0148619 A2 | 7/2001 |
| WO | 0150247 A2 | 7/2001 |
| WO | 0150679 A2 | 7/2001 |
| WO | 03030461 A1 | 4/2003 |

OTHER PUBLICATIONS

Doyle et al., Microsoft Press Computer Dictionary, 2.sup.nd ed., Microsoft Press, Redmond, Washington, USA, 1994, p. 326.
Fillo et al., "The M-Machine Multicomputer," IEEE Proceedings of MICRO-28, 1995, pp. 146-156.
Gomez et al., "Efficient Multithreaded User-Space Transport for Network Computing: Design and Test of the TRAP Protocol," Journal of Parallel and Distributed Computing, Academic Press, Duluth, Minnesota, USA, vol. 40, No. 1, Jan. 10, 1997, pp. 103-117.
Haug et al., "Reconfigurable hardware as shared resource for parallel threads," IEEE Symposium on FPGAs for Custom Computing Machines, 1998.
Hauser et al., "Garp: a MIPS processor with a reconfigurable coprocessor," Proceedings of the 5.sup.th Annual IEEE Symposium on Field-Programmable Custom Computing Machines, 1997.
Hyde, R., "Overview of Memory Management," Byte, vol. 13, No. 4, 1998, pp. 219-225. Litch et al., "StrongARMing Portable Communications," IEEE Micro, 1998, pp. 48-55.
Schmidt et al., "The Performance of Alternative Threading Architectures for Parallel Communication Subsystems," Internet Document, Online!, Nov. 13, 1998.
Thistle et al., "A Processor Architecture for Horizon," IEEE, 1998, pp. 35-41.
Tremblay et al., "A Three Dimensional Register File for Superscalar Processors," IEEE Proceedings of the 28.sup.th Annual Hawaii International Conference on System Sciences, 1995, pp. 191-201.
Trimberger et al, "A time-multiplexed FPGA," Proceedings of the 5.sup.th Annual IEEE Symposium on Field-Programmable Custom Computing Machines, 1998.
Turner et al., "Design of a High Performance Active Router," Internet Document, Online, Mar. 18, 1999.
Vibhatavanijt et al., "Simultaneous Multithreading-Based Routers," Proceedings of the 2000 International Conference of Parallel Processing, Toronto, Ontario, Canada, Aug. 21-24, 2000, pp. 362-359.
Wazlowski et al., "PRSIM-II computer and architecture," IEEE Proceedings, Workshop on FPGAs for Custom Computing Machines, 1993.

"10-/100-Mbps Ethernet Media Access Controller (MAC) Core", NEC, 1998, pp. 1-5.
"Nomadic Threads: A migrating multithread approach to remote memory accesses in multiprocessors", by Jenks, S.; Gaudiot, J.L. (abstract only) Publication Date: Oct. 20-23, 1996.
"Overview of the START (*T) multithreaded computer" by Beckeerie, M.J. (abstract only) Publication Date: Feb. 22-26, 1993.
A. Ippoliti, et al., "Parallel Media Access Controller for Packet Communications at Gb/s Rates", 1990, IEEE, pp. 991-996.
Howard Frazier, "Gigabit Ethernet: From 100 to 1,000 Mbps", 1999, IEEE Internet Computing, pp. 24-31.
Howard Frazier, "The 802.3z Gigabit Ethernet Standard", 1998, IEEE Network, pp. 6-7.
"Enterprise Hardware, Intel Expected to Unveil New Networking Chip," News.Com, Aug. 26, 1999, <http://new.com.com/Intel+expected+to+unveil+new+networking+chip/2100-- 1001.sub.--3-230315.html> (accessed on Aug. 23, 2005), pp. 1-5.
"The ATM Forum Technical Committee Traffic Management Specification Version 4.1", The ATM Forum (Mar. 1999).
Agarwal et al., "April: A Processor Architecture for Multiprocessing," Proceedings of the 17th Annual International Symposium on Computer Architecutre, IEEE, pp. 104-114, (1990).
Chandranmenon, G.P., et al., "Trading Packet Headers for Packet Processing", IEEE/ACM Transactions on Networking, 4(2):141-152, Apr. 1996.
Chappell, et al., "Simultaneous Subordinate Microthreading (SSMT)", IEEE, p. 186-195 (1999).
Dictionary of Computer Words: An A to Z Guide to Today's Computers, Revised Edition, Houghton Mifflin Company: Boston, Massachusetts, pp. 220, (1995).
Digital Semiconductor 21140A PCI Fast Ethernet LAN Controller, Hardware Reference Manual, Digital Equipment Corporation, pp. i-x, 1-1 through 1-5, 2-1 throught 2-12, 3-1 through 3-38, 4-31 through 5-2, 6-1 through 6-24, (Mar. 1998).
Farrens, et al., "Strategies for Achieving Improved Processor Throughput", ACM, p. 362-369 (1991).
Giroux, N., et al., "Queuing and Scheduling: Quality of Service in ATM Networks, Chapter 5", Quality of Service in ATM Networks: State-of-the-Art Traffic Management, pp. 96-121 (1998).
Govind, et al., "Performance modeling and architecture exploration of network processors", Quantitative Evaluation of Systems, abstract only (1 page), Sep. 2005.
Kaiserswerth, M., "The Parallel Protocol Engine", IEEE/ACM Transactions on Networking, 1(6):650-663, Dec. 1993.
Khailany, B., et al., "Imagine: Media Processing with Streams," IEEE Micro, Mar.-Apr. 2001, pp. 35-46.
Leon-Garcia, A., Communication Networks: Fundamental Concepts and Key Architectures, McGraw-Hill Higher Education, Copyright 2000, pp. 195-198, 215-219, & 380-385.
Lim, A., et al., "Improving Performance of Adaptive Media Access Control Protocols for High-Density Wireless Networks", Proceedings of the 1999 International Symposium on Parallel Architectures, Algorithms and Networks (ISPAN '99), pp. 316-321, Jun. 1999.
Mollenauer, J.F., et al., "An Efficient Media Access Control Protocol for Broadband Wireless Access Systems", IEEE Standard, IEEE 802.16 Broadband Wireless Access Working Group, 19 pages, Oct. 1999.
Ocheltree, K.B., et al., "A comparison of fibre channel and 802 MAC services", Proceedings of 18th Conference on Local Computer Networks, abstract only, 1 page, Sep. 1993.
Shaw, M.C., et al., UNIX Internals: A Systems Operations Handbook, Windcrest Books, pp. 30-37, 1987.
Todorova, P., et al., "Quality-of-Service-Oriented Media Access Control for Advanced Mobile Multimedia Satellite Systems", Proceedings of the 36th Annual Hawaii International Conference on System Sciences (HICSS'03), 8 pages, Jan. 2003.
Vuppala, V., et al., "Layer-3 switching using virtual network ports", IEEE Proc. Computer Communications and Networks, pp. 642-648, 1999.
Wikipedia entry, "Media Access Control", retrieved from http://en.wikipedia.org/wiki/Media.sub.--access.sub.--control, 2 pages, Jul. 31, 2007.

(56) References Cited

OTHER PUBLICATIONS

Non-Final Office Action dated May 9, 2016 issued in U.S. Appl. No. 14/809,423.
Non-Final Office Action dated May 9, 2016 issued in U.S. Appl. No. 14/882,824.
Non-Final Office Action dated May 6, 2016 issued in U.S. Appl. No. 14/882,897.
Final Office Action dated Nov. 18, 2016 issued in U.S. Appl. No. 14/809,423.
Final Office Action dated Nov. 18, 2016 issued in U.S. Appl. No. 14/882,824.
Final Office Action dated Nov. 18, 2016 issued in U.S. Appl. No. 14/882,897.

* cited by examiner

| ADDRESS SPACE (HEXADECIMAL) | |
|---|---|
| FFFF FFFF | |
| E7FF FFFF | |
| E000 0000 | |
| C000 0000 | SDRAM |
| B000 0000 | TRANSLATION UNIT 30 |
| A000 0000 | PCI CONFIG |
| 9000 0000 | SYSTEM |
| 8000 0000 | MAC & SRAM CONTROL REGISTERS |
| 4000 0000 | PCI UNIT |
| 0000 0000 | SRAM |

| HEXADECIMAL | MAPPED ADDRESSES | XXXX (BINARY) |
|---|---|---|
| B004 XXXX | FBUS INTERFACE (28) SCRATCHPAD (110) | 0100 xxxx xxxx xxxx |
| B004 XXXX | FBUS INTERFACE(28) REGISTERS (108) | 0000 xxxx xxxx xxxx |
| B000 XXXX | MICRO-ENGINE (22a) REGISTERS (78, 80) | 0110 1xxx xxxx xxxx |
| | MICRO-ENGINE (22b) REGISTERS (78, 80) | 0110 0xxx xxxx xxxx |
| | MICRO-ENGINE (22c) REGISTERS (78, 80) | 0001 1xxx xxxx xxxx |
| | MICRO-ENGINE (22d) REGISTERS (78, 70) | 0001 0xxx xxxx xxxx |
| | MICRO-ENGINE (22e) REGISTERS (78, 80) | 0000 1xxx xxxx xxxx |
| | MICRO-ENGINE (22f) REGISTERS (78, 80) | 0000 0xxx xxxx xxxx |
| B000 XXXX | MICRO-ENGINE (22a) REGISTERS (76b) | 0010 1xxx xxxx xxxx |
| | MICRO-ENGINE (22b) REGISTERS (76b) | 1101 0xxx xxxx xxxx |
| | MICRO-ENGINE (22c) REGISTERS (76b) | 0001 1xxx xxxx xxxx |
| | MICRO-ENGINE (22d) REGISTERS (76b) | 0001 0xxx xxxx xxxx |
| | MICRO-ENGINE (22e) REGISTERS (76b) | 0000 1xxx xxxx xxxx |
| | MICRO-ENGINE (22f) REGISTERS (76b) | 0000 0xxx xxxx xxxx |

MEMORY MAPPING IN A PROCESSOR HAVING MULTIPLE PROGRAMMABLE UNITS

CROSS-REFERENCE TO RELATED APPLICATIONS

This application is a continuation of U.S. application Ser. No. 14/809,423, entitled "MEMORY MAPPING IN A PROCESSOR HAVING MULTIPE PROGRAMMABLE UNITS" filed Jul. 27, 2015 which is a continuation of U.S. application Ser. No. 14/286,055, entitled "MEMORY MAPPING IN A PROCESSOR HAVING MULTIPE PROGRAMMABLE UNITS" filed May 23, 2014 which is a continuation of U.S. application Ser. No. 10/780,330, entitled "MEMORY MAPPING IN A PROCESSOR HAVING MULTIPLE PROGRAMMABLE UNITS" filed Feb. 17, 2004 now patented as U.S. Pat. No. 8,738,886 issued on May 27, 2014 which is a continuation of U.S. application Ser. No. 09/743,271, entitled "MAPPING REQUESTS FROM A PROCESSING UNIT THAT USES MEMORY-MAPPED INPUT-OUTPUT SPACE" filed Dec. 27, 1999 now patented as U.S. Pat. No. 6,694,380 issued on Feb. 17, 2004. This application claims the benefit to the Ser. No. 09/743,271 application via the co-pending Ser. No. 10/780, 330 application.

BACKGROUND OF THE INVENTION

This invention relates to parallel processors.

Parallel processing is an efficient form of information processing of concurrent events in a computing process. Parallel processing demands concurrent execution of many programs in a computer, in contrast to sequential processing. In the context of a parallel processor, parallelism involves doing more than one function at the same time. Unlike a serial paradigm in which all tasks are performed sequentially at a single station or a pipelined machine where tasks are performed at specialized stations, with parallel processing, multiple stations are provided with each station capable of performing all tasks. That is, in general, all or some of the stations work simultaneously and independently on the same or common elements of a problem. Certain problems are suitable for solution by applying parallel processing.

SUMMARY OF THE INVENTION

The apparatus includes circuitry to map addresses in a single address space to resources within the multiple programmable units where the single address space includes addresses for different ones of the resources in different ones of the multiple programmable units and where there is a one-to-one correspondence between respective addresses in the single address space and resources within the multiple programmable units. The apparatus can provide data access to a resource within a first of the multiple programmable units to a second one of the multiple programmable units in response to a data access request of the second one of the multiple programmable units that specifies an address within the single address space.

Various features and advantages will be readily apparent from the following detailed description, the drawings, and the claims.

DESCRIPTION OF THE PREFERRED EMBODIMENTS

Figure 1:
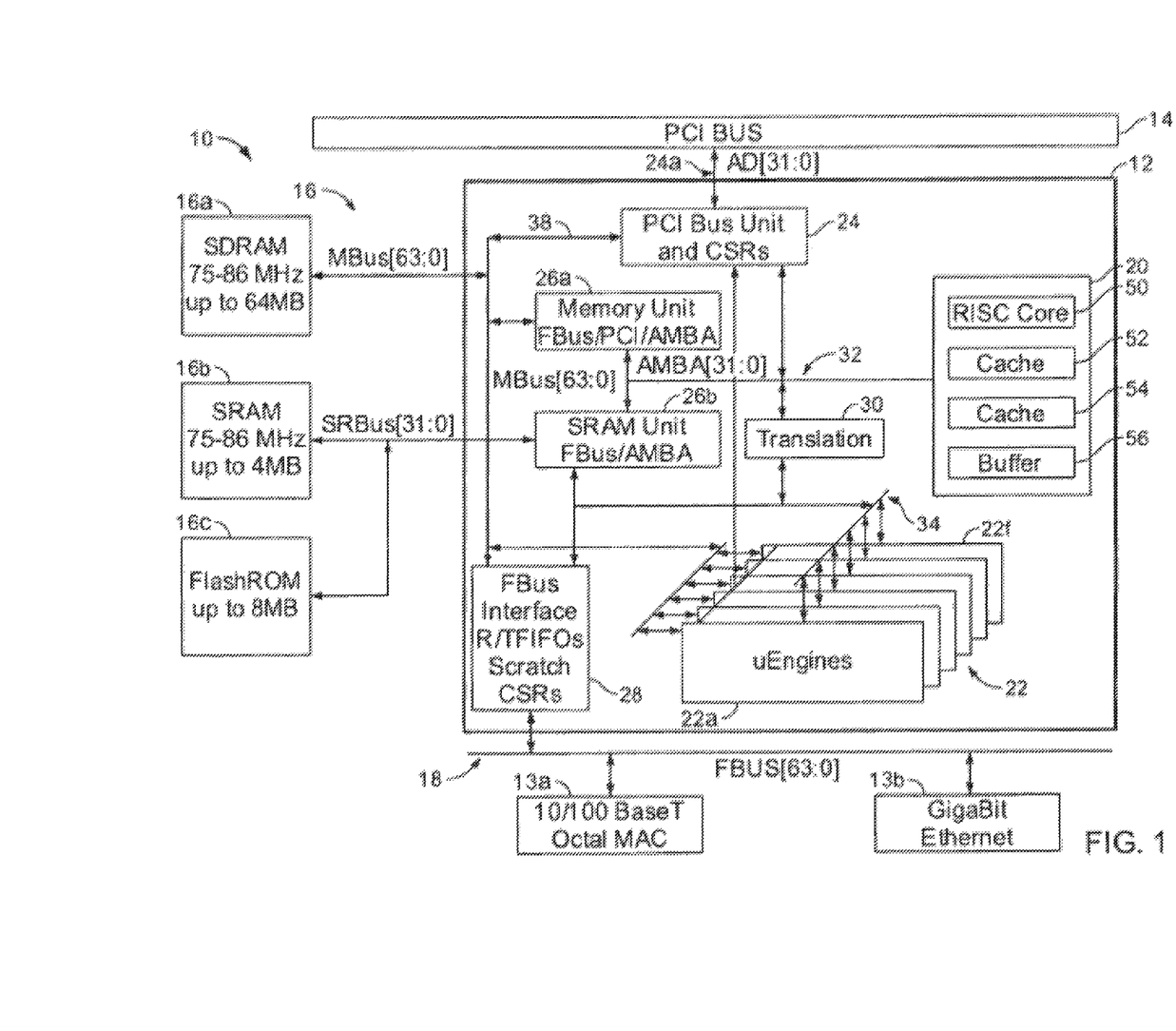
FIG. 1 is a block diagram of a communication system employing a hardware-based multithreaded processor.

Referring to FIG. 1, a communication system 10 includes a parallel, hardware-based multithreaded processor 12. The hardware-based multithreaded processor 12 is coupled to a bus such as a Peripheral Component Interconnect (PCI) bus 14, a memory system 16 and a second bus 18. The system 10 is especially suited for tasks that can be broken into parallel sub-tasks or functions. Specifically, multithreaded processor 12 is useful for tasks that are bandwidth oriented rather than latency oriented. The multithreaded processor 12 has multiple micro-coded processing engines (micro-engines) 22 each with multiple hardware controlled threads that can be simultaneously active and can independently work on a task.

The multithreaded processor 12 includes a central processing unit (CPU) 20 that assists in loading micro-code control for other resources of the multithreaded processor 12 and performs other general purpose computer-type functions such as handling protocols, exceptions, extra support for packet processing where the micro-engines pass the packets off for more detailed processing such as in boundary conditions. The CPU 20 can be implemented, for example, as a general purpose processor. In one embodiment, the CPU 20 is a Strong Arm® (Arm is a trademark of ARM Limited, United Kingdom) based architecture. The CPU 20 has an operating system through which the CPU can call functions to operate on the micro-engines 22a-22f. The CPU 20 can use any supported operating system and preferably uses a real time operating system. For the CPU implemented as a Strong Arm architecture, operating systems such as, MicrosoftNT real-time, VXWorks and uCUS, a freeware operating system available over the Internet, can be used.

The central processing unit (CPU) 20 includes a processor that uses memory-mapped input-output (I/O) space. For example, in one implementation, the CPU 20 includes a reduced instruction set computer (RISC) engine 50 (FIG. 1) that can be implemented in a five-stage pipeline that performs a single cycle shift of one operand or two operands in a single cycle and provides multiplication support and 32-bit barrel shift support. The RISC engine 50 can have a standard Strong Arm® architecture but it is implemented with a five-stage pipeline for performance reasons. The CPU 20 also includes a 16-kilobyte instruction cache 52, an 8-kilobyte data cache 54 and a pre-fetch stream buffer 56. The CPU 20 performs arithmetic operations in parallel with memory write operations and instruction fetches. The CPU 20 interfaces with other functional units via the 32-bit bi-directional ASB bus 32.

The memory system 16 includes a Synchronous Dynamic Random Access Memory (SDRAM) controller 26a and a Synchronous Random Access Memory (SRAM) controller 26b. SDRAM memory 16a and SDRAM controller 26a are typically used for processing large volumes of data, for example, processing network payloads from network packets. SRAM memory 16b and SRAM controller 26b are used in a networking implementation for low latency, fast access tasks, for example, accessing look-up tables, memory for the CPU 20, and so forth.

The CPU 20 is able to access the shared resources. For example, the CPU 20 has a direct communication to the SDRAM controller 26a, to the bus interface 24 and to the SRAM controller 26b via bus 32.

Advantages of hardware multithreading can be explained by SRAM or SDRAM memory accesses. As an example, an SRAM access requested by a Thread_0, from a micro-engine 22 will cause the SRAM controller 26b to initiate an access to the SRAM memory 16b. The SRAM controller controls arbitration for the SRAM bus, accesses the SRAM 16b, fetches the data from the SRAM 16b, and returns data to a requesting micro-engine 22a-22b. During an SRAM access, if the micro-engine, for example micro-engine 22a, had only a single thread that could operate, that micro-engine would be dormant until data was returned from the SRAM. By employing hardware context swapping within each of the micro-engines 22a-22f, the hardware context swapping enables other contexts with unique program counters to execute in that same micro-engine. Thus, another thread, for example Thread_1, can function while the first thread Thread_0 is awaiting the read data to return. During execution, Thread_1 may access the SDRAM memory 16a. While Thread_1 operates on the SDRAM unit, and Thread_0 is operating on the SRAM unit, a new thread, for example Thread_2, can now operate in the micro-engine 22a. Thread_2 can operate until it needs to access memory or perform some other long latency operation, such as making an access to a bus interface. Therefore, simultaneously, the processor 12 can have a bus operation, SRAM operation and SDRAM operation all being completed or operated upon by one micro-engine 22a and have one more thread available to process more work in the data path.

An exemplary application for the hardware-based multi-threaded processor 12 is as a network processor. As a network processor, the multithreaded processor 12 serves as an interface to network devices such as a media access controller (MAC) device, for example, a 10/100BaseT Octal MAC 13a or a Gigabit Ethernet device 13b. In general, as a network processor, the multithreaded processor 12 can interface to any type of communication device or interface that receives or sends large amounts of data. When functioning in a networking application, the communication system 10 can receive multiple network packets from the devices 13a, 13b and process those packets in a parallel manner. With the hardware-based multithreaded processor 12, each network packet can be independently processed.

The processor 12 also can be used as a print engine for a postscript processor, as a processor for a storage subsystem, for example, RAID disk storage, or as a matching engine. In the securities industry, for example, the advent of electronic trading requires the use of electronic matching engines to match orders between buyers and sellers. These and other parallel types of tasks can be accomplished on the system 10.

The processor 12 includes a bus interface 28 that couples the processor to the second bus 18. The bus interface 28 can couple the processor 12, for example, to a first-in-first-out (FIFO) bus (FBUS) 18. The FBUS interface 28 is responsible for controlling the interface between the processor 12 and the 64-bit wide FBUS 18.

The processor 12 also includes a Peripheral Component Interconnect (PCI) bus interface 24 that can couple other system components that reside on the PCI 14 bus to the processor 12. The PCI bus interface 24 provides a high-speed data path 24a to the memory 16. Data can be moved through that path quickly from the SDRAM 16a through the PCI bus 14, via direct memory access (DMA) transfers.

Each of the functional units is coupled to one or more internal buses. The internal buses can be dual, 32-bit buses, in other words, one bus for read operations and one bus for write operations. The multithreaded processor 12 is arranged such that the sum of the bandwidths of the internal buses in the processor 12 exceeds the bandwidth of external buses coupled to the processor 12. The processor 12 includes an internal core processor bus 32, for example, an ASB bus (Advanced System Bus) that couples the CPU 20 to the memory controllers 26a, 26b and to an ASB translator 30 described below. The ASB bus 32 is a subset of the AMBA bus that is used with the processor core. The processor 12 also includes a private bus 34 that couples the micro-engine units 22 to the SRAM controller 26b, the translator 30 and the FBUS interface 28. A memory bus 38 couples the memory controllers 26a, 26b to the bus interfaces 24, 28 and memory system 16 including flash-ROM 16c used for boot operations and the like.

Micro-Engines

Each micro-engine 22a-22f maintains program counters in hardware and has states associated with the program counters. Corresponding sets of threads can be simultaneously active on each of the micro-engines 22a-22f while only one is actually operating at any one time.

In one implementation, there are six micro-engines 22a-22f each of which is capable of processing four hardware threads. The micro-engines 22a-22f operate with shared resources including the memory system 16 and bus interfaces 24 and 28.

Figure 2:
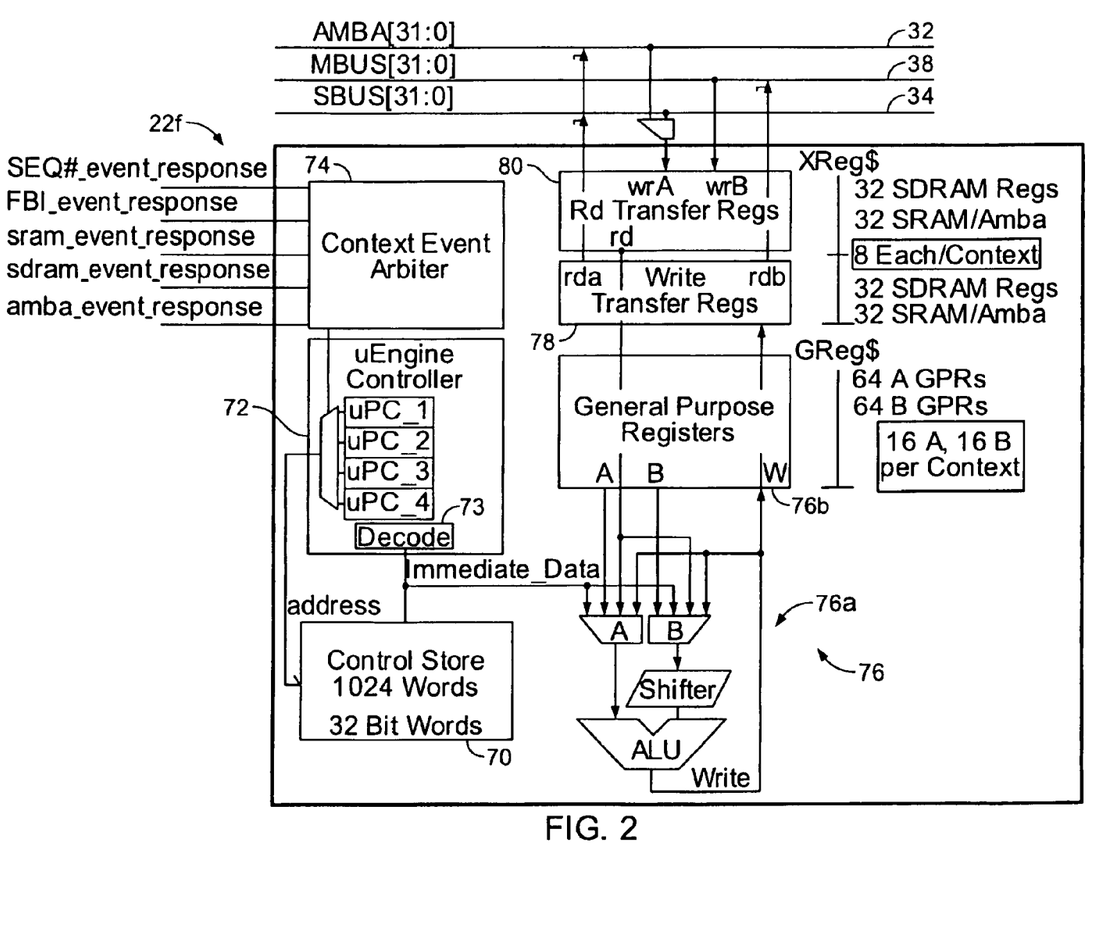
FIG. 2 is a block diagram of a micro-engine functional unit employed in the multithreaded processor of FIG. 1.

Referring to FIG. 2, an exemplary one of the micro-engines, such as micro-engine 22f, includes a control store 70 that, in one implementation, includes a random access memory (RAM) of 1,024 32-bit words. The RAM stores a micro-program that is loadable by the CPU 20. The micro-engine 22f also includes controller logic 72 that has an instruction decoder 73 and program counter (PC) units 72a-72d maintained in hardware. The micro-engine 22f includes context event switching logic 74 that receives messages from the shared resources. The messages provide information on whether a requested function has completed. The context event logic 74 includes arbitration for the four threads.

The micro-engine 22f includes an execution box data path 76 that has an arithmetic logic unit 76a and a general purpose register set 76b. The arithmetic logic unit 76a performs arithmetic and logical functions as well as shift functions. The register set 76b has a relatively large number of general purpose registers that are relatively and absolutely addressable.

The micro-engine 22f also includes a write transfer register stack 78 and a read transfer register stack 80 that are relatively and absolutely addressable. Write-data to a resource is located in the write transfer register stack 78. Similarly, the read register stack 80 is used for return data from a shared resource. Subsequent to or concurrent with data arrival, an event signal from the respective shared resource is provided to the context event switching logic 74 which alerts the thread that the data is available or has been sent.

Data functions are distributed among the micro-engines 22. Connectivity to the SRAM 26a, SDRAM 26b and FBUS interface 28 is through command requests. Command requests include memory requests FBUS requests. For example, a command request can move data from a register located in a micro-engine 22 to a shared resource, for example, an SDRAM location, SRAM location, flash memory or a MAC address. The commands are sent out to each of the functional units and the shared resources. However, the shared resources do not need to maintain local buffering of the data. Rather, the shared resources access distributed data located inside of the micro-engines. This enables the micro-engines 22a-22f to have local access to data rather than arbitrating for access on a bus and risk contention for the bus. With this feature there is a 0 cycle stall for waiting for data internal to the micro-engines 22a-22f.

FBUS Interface (FBI)

Figure 3A:
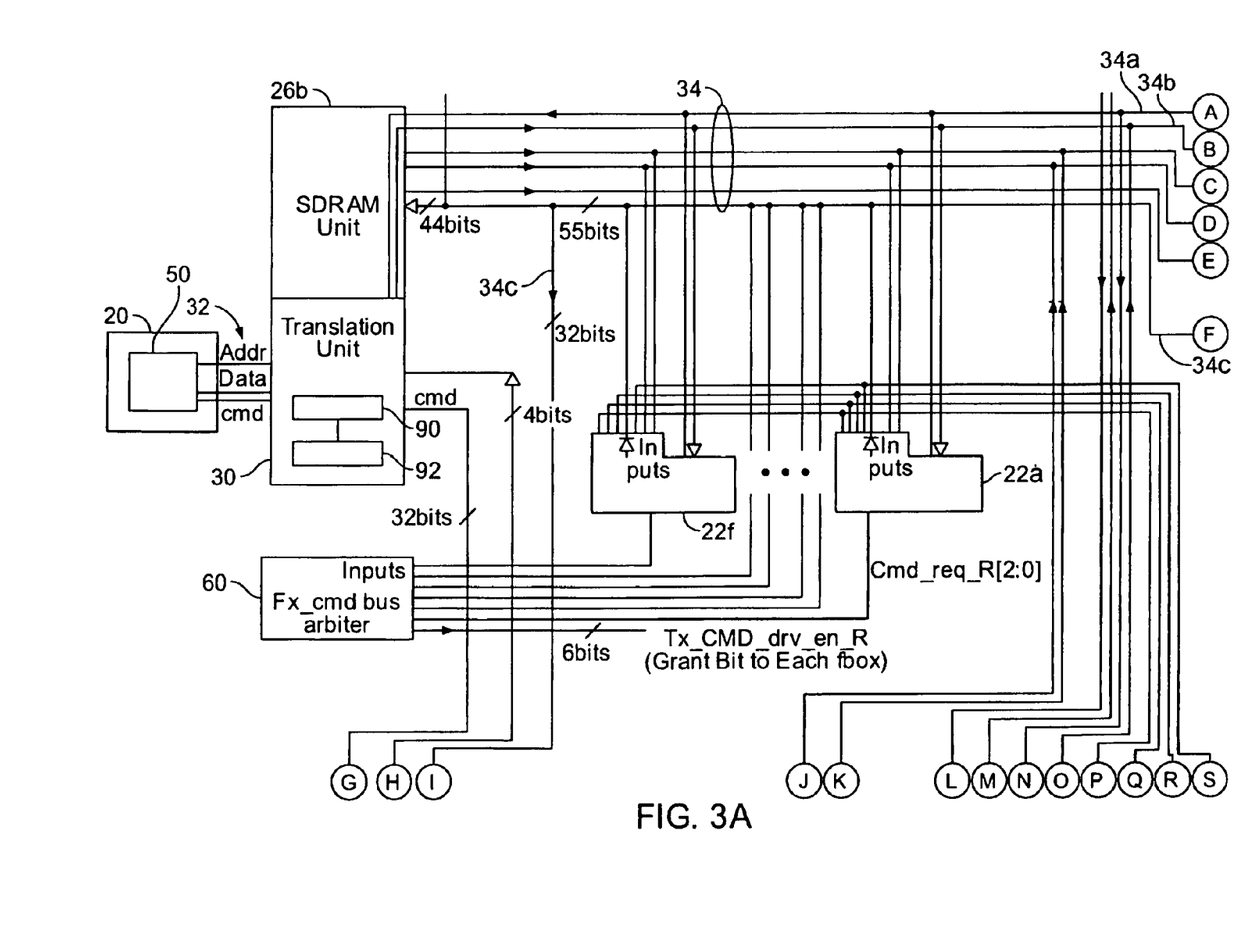
FIGS. 3A-3C are block diagrams illustrating interface units used for converting CPU commands directed to the I/O memory space address of micro-engines or a bus interface unit.
Figure 3B:
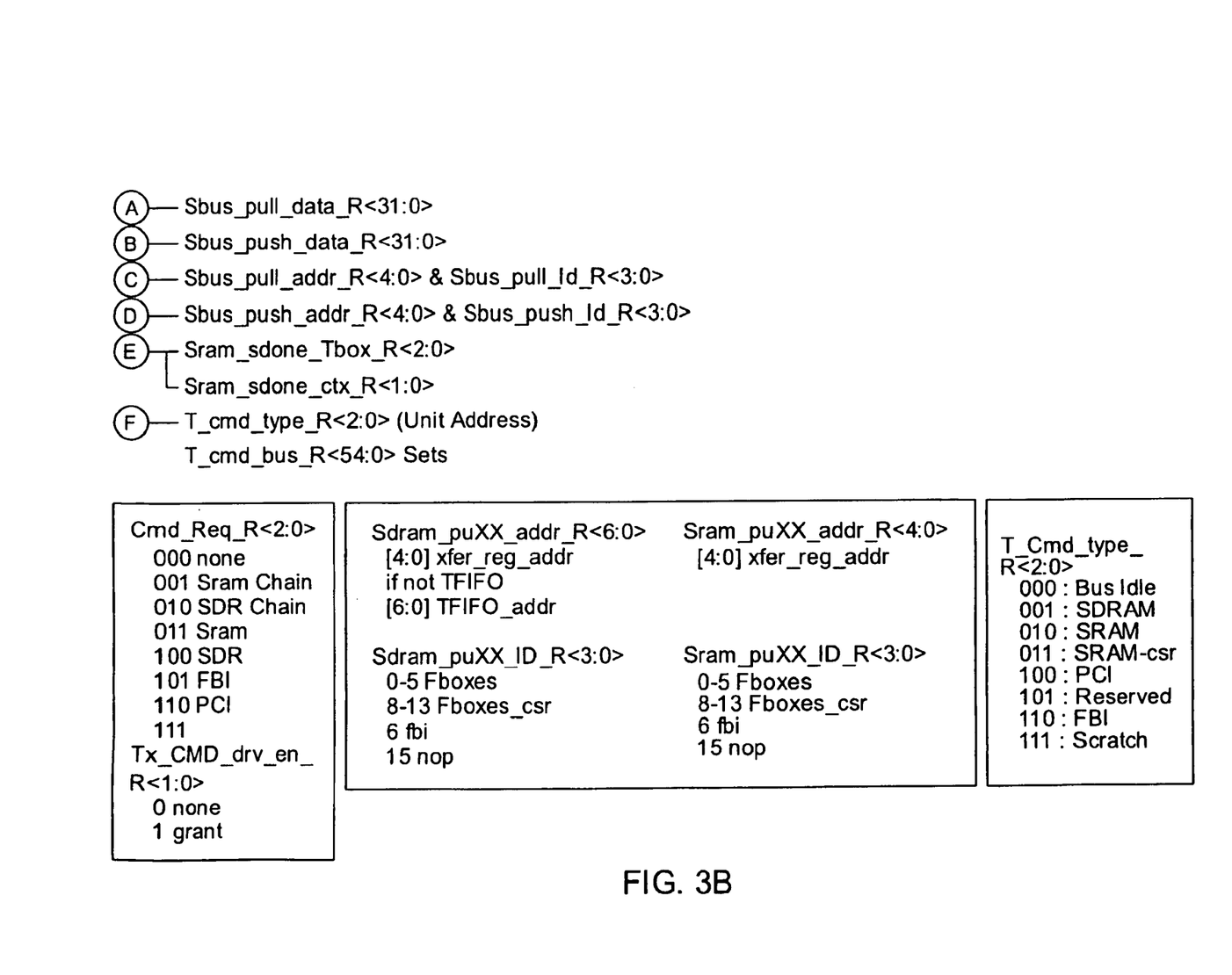
Figure 3C:
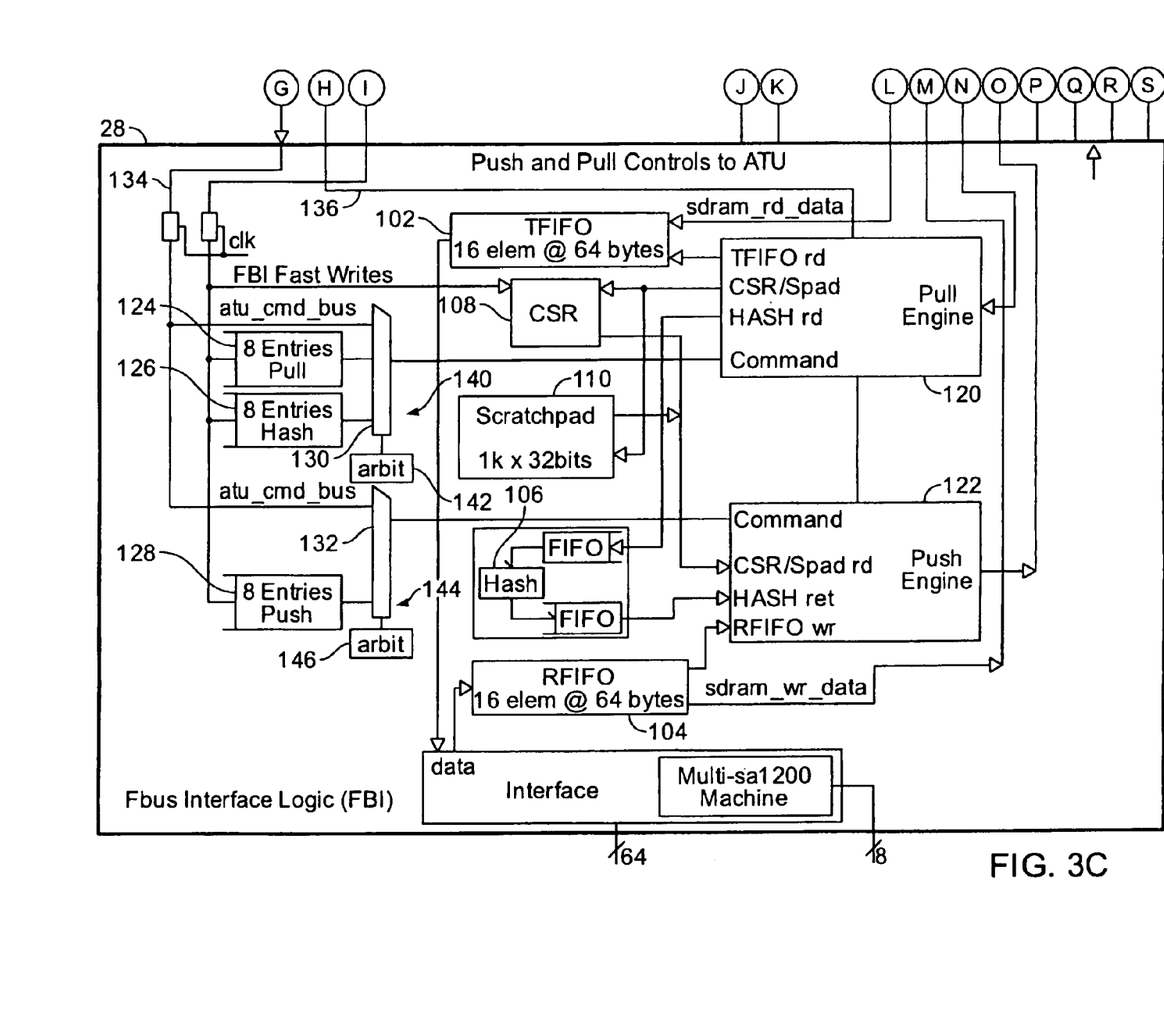

Referring to FIGS. 3A-3C, the FBUS interface 28 contains a transmit FIFO 102, a receive FIFO 104, a HASH unit 106 and control and status registers 108. The FBUS interface 28 also includes a scratchpad memory 110.

The FBUS interface 28 has a push engine 120 for pushing data into the transfer registers 78, 80 during the cycles when the SRAM is not using the SRAM data bus. The FBUS interface 28 also includes a pull engine 122 for retrieving data from the transfer registers 78, 80 in the micro-engines 22. The engines 120, 122 are implemented within the FBUS interface control logic.

In general, data transfers between the FBUS interface 28 and the micro-engines 22 are accomplished over the bus 34 via the transfer registers 78, 80 in the micro-engines and the push and pull engines 120, 122 in the FBUS interface 28. As previously mentioned, in some implementations, the bus 34 includes two data buses each of which is unidirectional. One bus (Sbus_pull_data) 34A is used for transferring data into the FBUS interface 28 and another bus (Sbus_push_data) 34B is used for returning data to the micro-engines 22. The buses 34A, 34B use control signals that provide read/write control to the appropriate transfer registers 78, 80 in one of the micro-engines 22.

A global command arbiter 60 enables commands from the micro-engines 22 to be driven onto a command bus 34C. The various units in the FBUS interface 28 communicate with the micro-engines 22 through time-multiplexed access to the bus 34. A command from a micro-engine 22 involving the FBUS interface 28 is loaded into a one of several queues: a pull command queue 124, a hash command queue 126 or a push command queue 128. Commands in the pull and hash queues 124, 126 then can be passed to the pull engine 120 via a multiplexer 130. Similarly, commands in the push queue 128 can be passed to the push engine 132 via a multiplexer 132.

Figure 4:
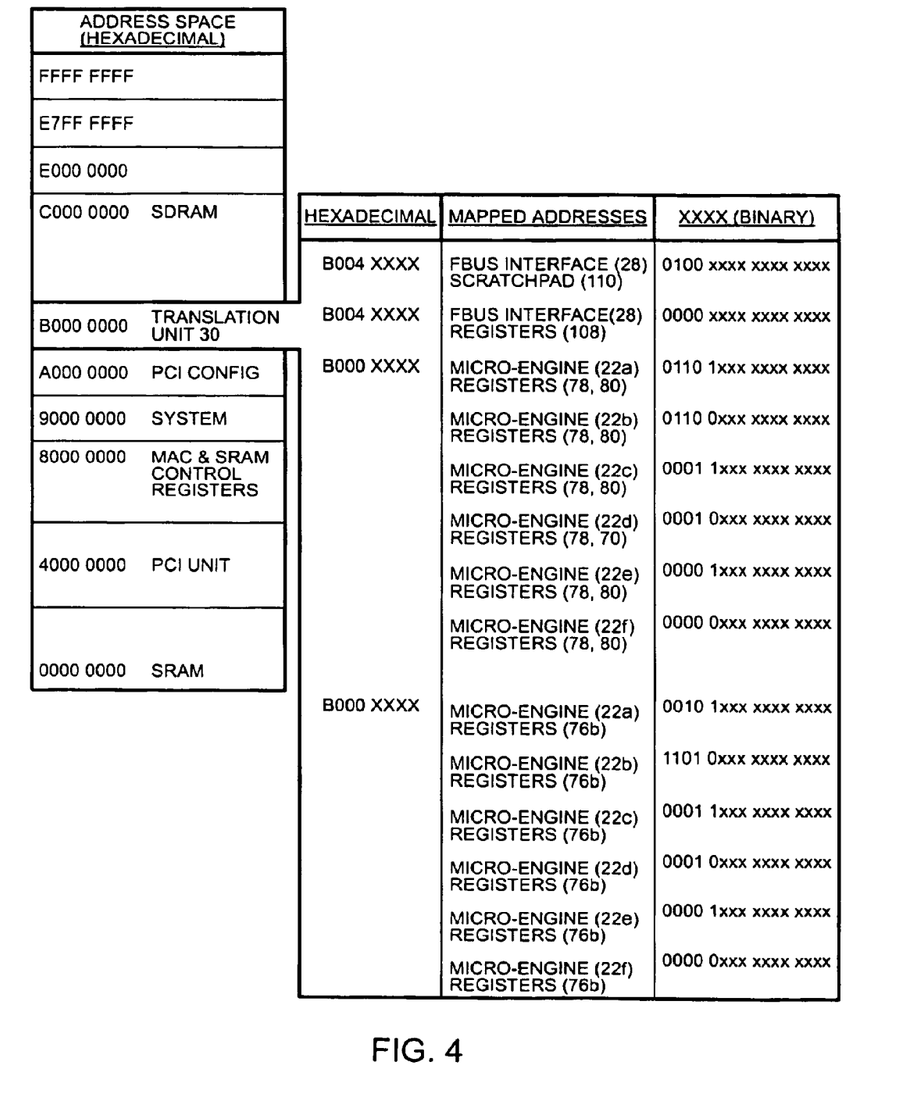
FIG. 4 illustrates an exemplary address space map for the CPU.

References from the CPU 20 to the registers 78, 80 in the micro-engines 22 as well as to the registers 108 or scratchpad 110 in the FBUS interface 28 are mapped in the input/output (I/O) space of the CPU. An exemplary mapping of the I/O space of the CPU 20 is illustrated in FIG. 4.

Translation Unit

Still referring to FIGS. 3A-3C, the translation unit 30 converts address space requests from the CPU 20 into commands that simulate operations between the micro-engines 22 and the FBUS interface unit 28 with the core processor bus 32 acting as either the source or destination of the data. For example, the translation unit 30 performs address translations between micro-engine transfer register locations and CPU addresses so that the CPU 20 can access registers belonging to the micro-engines 22. READ and WRITE operations from the core processor bus 32 to the micro-engines 22 appear to the micro-engines like operations from the FBUS interface 28.

The translation unit 30 also performs address translations between FBUS interface register locations and CPU addresses so that the CPU 20 can access registers in the FBUS interface 28. Similarly, the translation unit 30 performs address translations between the FBUS scratchpad location and a corresponding CPU address so that the CPU 20 can access the scratchpad 110. When the CPU 20 performs a READ or WRITE operation with respect to a destination in the FBUS interface 28, the translation unit 30 appears to the FBUS interface as simply another micro-engine 22 with one read transfer register and one write transfer register.

In general, the translation unit 30 maps the CPU address and READ/WRITE signal into a command for the pull engine 120 or the push engine 122. The translation unit 30 contains hardwired sequencing logic 90 and registers 92 that respond to control signals from the pull and push engines to supply or receive the targeted data. In other implementations, the translation unit 30 can include a programmable logic array (PLA). Although the translation unit 30 can physically reside in the FBUS interface 28, it is logically distinct.

Figure 5:
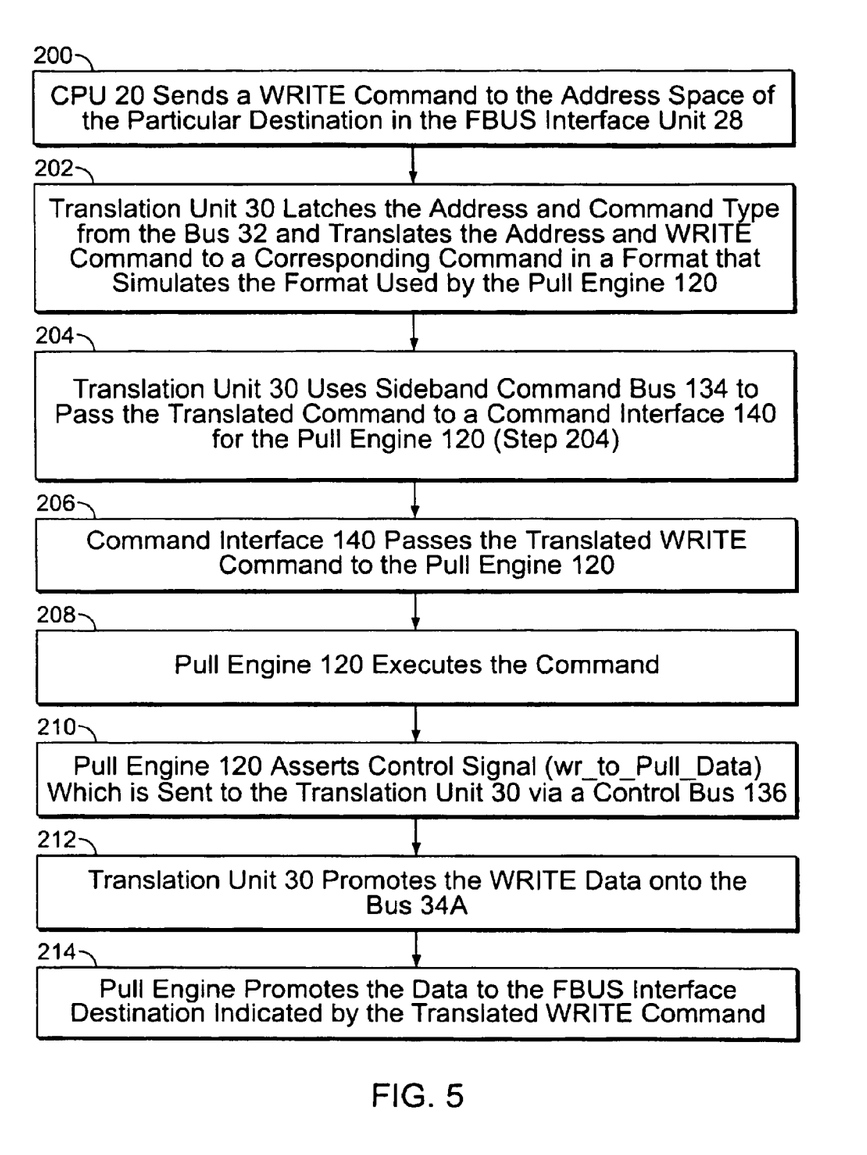
FIG. 5 is a flow chart illustrating a method of writing data from the CPU to a destination in a first-in-first-out (FIFO) bus interface.

Referring to FIG. 5, to initiate a WRITE operation from the CPU 20 to a particular destination in the FBUS interface 28, such as a control and status register 108 or the scratchpad 110, the CPU sends 200 a WRITE command to the address space of the particular register or the scratchpad. The translation unit 30 latches the address and command type from the bus 32 and translates 202 the address and the WRITE command to a corresponding command in a format that simulates the format used by the pull engine 120. A latched register in the translation unit 30 simulates a source output transfer register in one of the micro-engines 22. The translation unit 30 uses a sideband command bus 134 to pass 204 the translated command to a command interface 140 for the pull engine 120. The command interface 140 includes the multiplexer 130 and an arbiter 142 that determines the priority in which the various commands from the queues 124, 126 and the bus 134 are forwarded to the pull engine 120. In general, commands from the translation unit 30 are given priority over other commands in the queues 124, 126.

The command interface 140 passes 206 the translated WRITE command to the pull engine 120, which executes 208 the command. The pull engine 120 asserts 210 a control signal (wr_to_pull_data) that is sent to the translation unit 30 via a control bus 136. The control signal (wr_to_pull_data) serves to instruct the translation unit 30 to promote 212 the WRITE data onto the Sbus_pull_data bus 34A. Once the pull engine 120 has pulled the WRITE data from the translation unit 30, it promotes 214 the data to the FBUS interface destination indicated by the translated WRITE command.

Figure 6:
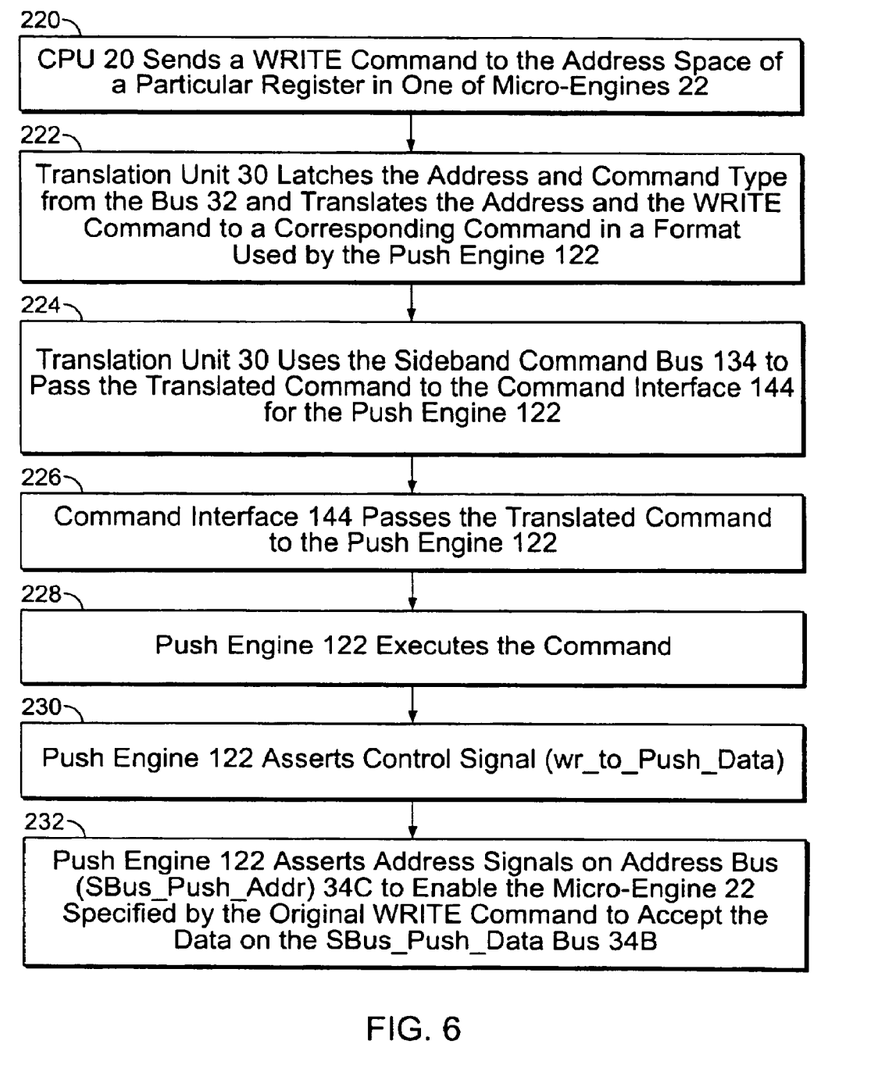
FIG. 6 is a flow chart illustrating a method of writing data from the CPU to a register in one of the micro-engines.

Referring to FIG. 6, to initiate a WRITE operation from the CPU 20 to a particular register 76b, 78, 80, in one of the micro-engines 22, the CPU sends 220 a WRITE command to the address space of the particular register. The translation unit 30 latches 222 the address and command type from the bus 32 and translates the address and the WRITE command to a corresponding command in a format recognized by the push engine 122. In other words, a push command is simulated with a latched register in the translation unit 30 serving as a register 108 (or scratchpad 110) in the FBUS interface 28. The translation unit 30 uses the sideband command bus 134 to pass 224 the translated command to a command interface 144 for the push engine 122. The command interface 144 includes the multiplexer 132 and an arbiter 146 that determines the priority in which the various commands from the queue 128 and the bus 134 are forwarded to the push engine 122. In general, commands from the translation unit 30 are given priority over commands in the queue 128.

The command interface 144 passes 226 the translated command to the push engine 122 which executes 228 the command. The push engine 122 asserts 230 a control signal (wr_to_push_data) that is sent to the translation unit 30 via the control bus 136 (step 230). The control signal (wr_to_push_data) serves to instruct the translation unit 30 to promote the WRITE data onto the Sbus_push_data bus 34B. At substantially the same time, the push engine 122 asserts 232 address signals on an address bus (Sbus_push_addr) 34C to enable the micro-engine 22 specified by the original WRITE command to accept the data on the Sbus_push_data bus 34B.

Figure 7:
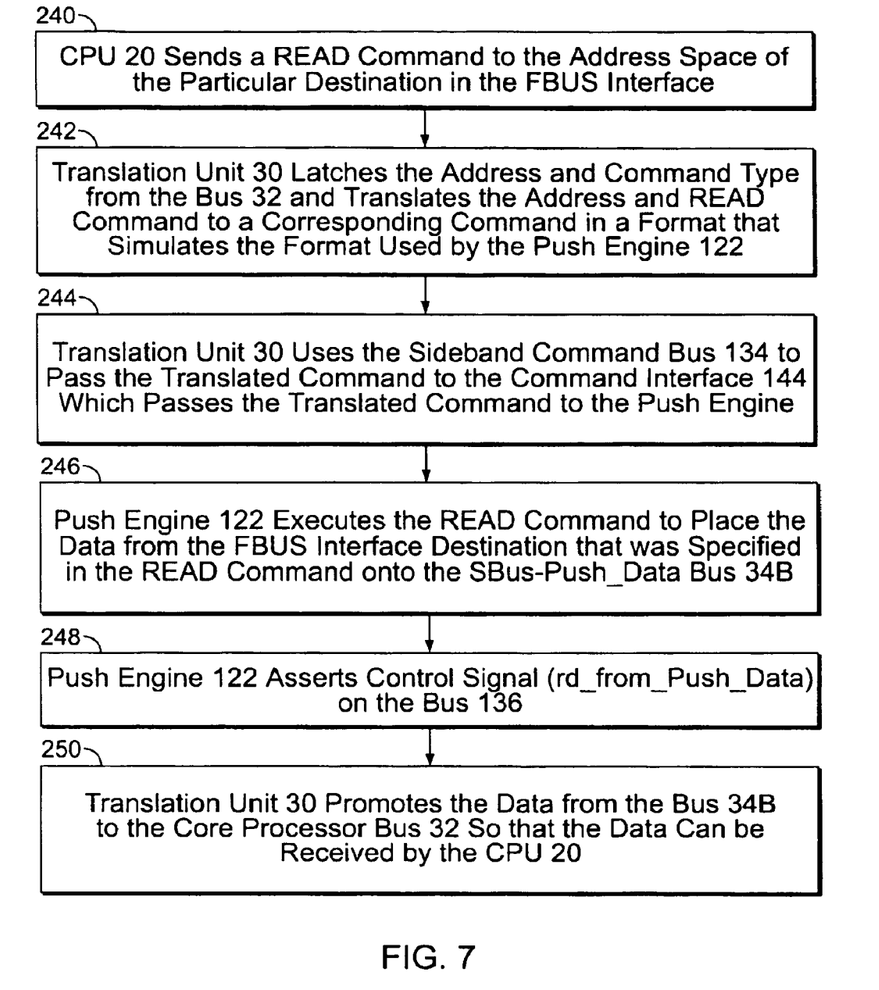
FIG. 7 is a flow chart illustrating a method of the CPU reading data from a destination in the FIFO bus interface.

Referring to FIG. 7, to initiate a READ operation with respect to a particular destination in the FBUS interface 28, such as a control and status register 108 or the scratchpad 110, the CPU 20 sends 240 a READ command to the address space of the particular FBUS interface destination. The translation unit 30 latches 242 the address and command type from the bus 32 and translates the address and READ command to a corresponding command in a format that simulates the format recognized by the push engine 122. A push command is simulated with a latched register in the translation unit 30 bus 32 serving as the destination input transfer register. The translation unit 30 uses the sideband command bus 134 to pass 244 the translated command to the command interface 144 which passes the translated command to the push engine. As previously mentioned, commands from the translation unit 30 are given priority by the arbiter 146 over commands in the queue 128.

The push engine 122 executes 246 the READ command to place the data from the FBUS interface destination that was specified in the READ command onto the Sbus-Push_data bus 34B. At substantially the same time, the push engine 122 asserts 248 a control signal (rd_from_push_data) on the bus 136. The control signal (rd_from_push_data) serves to instruct the translation unit 30 to promote 250 the data from the bus 34B to the core processor bus 32 so that the data can be received by the CPU 20.

Figure 8:
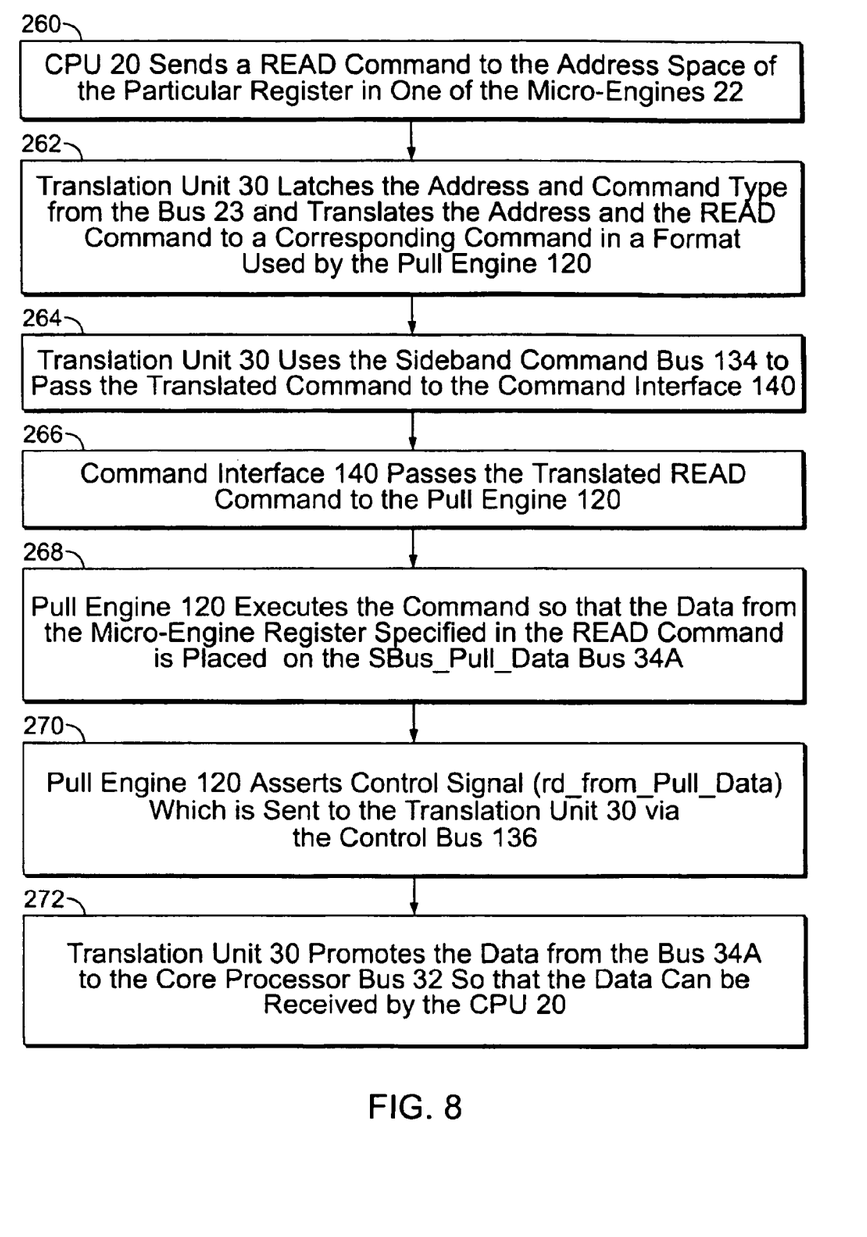
FIG. 8 is a flow chart illustrating a method of the CPU reading data from a register in one of the micro-engines.

Referring to FIG. 8, to initiate a READ operation with respect to a particular register 76b, 78, 80 in one of the micro-engines 22, the CPU 20 sends 260 a READ command to the address space of the particular register. The translation unit 30 latches 262 the address and command type from the bus 23 and translates the address and the READ command to a corresponding command in a format recognized by the pull engine 120. In other words, a pull command is simulated with a latched register in the translation unit 30 serving as the FBUS interface destination register. The translation unit 30 uses the sideband command bus 134 to pass 264 the translated command to the command interface 140. As previously explained, the arbiter 142 gives priority to commands from the translation unit 30 over commands in the queues 124, 126.

The command interface 140 passes 266 the translated READ command to the pull engine 120 that executes 268 the command so that the data from the micro-engine register specified in the READ command is placed on the Sbus_pull_data bus 34A. At substantially the same time, the pull engine 120 asserts 270 a control signal (rd_from_pull_data) which is sent to the translation unit 30 via the control bus 136. The control signal (rd_from_pull_data) instructs the translation unit 30 to promote 272 the data from the bus 34A to the core processor bus 32 so that the data can be received by the CPU 20.

The address and command conversions performed by the translation unit 30 allow the CPU 20 to transfer data to and from registers in the micro-engines 22 and the FBUS interface 28 using existing data buses (i.e., the bus 34) and existing control logic (i.e., the push and pull engines 120, 122). The complexity of additional control logic as well as additional logic to arbitrate between data requests from the various sources can be avoided.

Other implementations are within the scope of the following claims.

What is claimed is:

1. A system comprising:
   a synchronous dynamic random access memory (SDRAM) controller coupled to an SDRAM;
   a plurality of programmable multithreaded processing engines to process network packets, the plurality of programmable multithreaded processing engines comprising memory mapped registers;
   a reduced instruction set computer (RISC) processor coupled to the SDRAM controller and the plurality of programmable multithreaded processing engines, the RISC processor to receive and process packets from the plurality of programmable multithreaded processing engines;
   circuitry to enable the RISC processor to transfer data to and from the memory mapped registers of the plurality of programmable multithreaded processing engines, the circuitry comprising translation logic coupled to the RISC processor and the plurality of programmable multithreaded processing engines, the translation logic to convert a read or write operation in a first format to a corresponding read or write operation in a second format to enable the RISC processor to transfer data to and from the memory mapped registers of the plurality of programmable multithreaded processing engines; and
   a gigabit Ethernet device coupled to the plurality of programmable multithreaded processing engines.

* * * * *